(12) United States Patent
Fukuhara et al.

(10) Patent No.: US 8,772,179 B2
(45) Date of Patent: Jul. 8, 2014

(54) PATTERN FORMING METHOD, PATTERN FORMING APPARATUS, AND METHOD FOR MANUFACTURING SEMICONDUCTOR DEVICE

(75) Inventors: Kazuya Fukuhara, Tokyo (JP); Masayuki Hatano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 13/607,504

(22) Filed: Sep. 7, 2012

(65) Prior Publication Data

US 2013/0217155 A1 Aug. 22, 2013

(30) Foreign Application Priority Data

Feb. 20, 2012 (JP) ................................ P2012-034461

(51) Int. Cl.
*H01L 21/00* (2006.01)
(52) U.S. Cl.
USPC ............................................ 438/778; 438/14
(58) Field of Classification Search
None
See application file for complete search history.

(56) References Cited

U.S. PATENT DOCUMENTS

| 7,354,698 | B2 | 4/2008 | Van Santen et al. |
| 7,641,468 | B2 | 1/2010 | Wu et al. |
| 7,668,684 | B2 | 2/2010 | Muro et al. |
| 2009/0224436 | A1 | 9/2009 | Mikami et al. |
| 2011/0052217 | A1 | 3/2011 | Mochizuki |
| 2011/0097827 | A1 | 4/2011 | Hatano et al. |
| 2011/0187014 | A1 | 8/2011 | Taylor et al. |

FOREIGN PATENT DOCUMENTS

| JP | 2007-180178 | 7/2007 |
| JP | 2009-087959 | 4/2009 |
| JP | 2009-212449 | 9/2009 |
| JP | 4557890 | 7/2010 |
| JP | 2011-091307 | 5/2011 |
| WO | 2007/083725 A1 | 7/2007 |

*Primary Examiner* — Scott B Geyer
(74) *Attorney, Agent, or Firm* — Patterson & Sheridan, LLP (57) ABSTRACT

According to one embodiment, a pattern forming method using a template containing a pattern that has at least one recess section or protrusion section to transfer the shape of the pattern to a resin layer on a substrate, is provided. The method includes a process for coating the resin on the substrate, a process for making the hardness of the first portion as a portion of the resin higher than the hardness of the second portion as the portion other than the first portion, and a process in which the portion other than the pattern of the template makes contact with the first portion, in a state where a gap is maintained between the template and the resin, the shape of the pattern is transferred to the second portion, and the resin is cured. Embodiments of an apparatus for pattern forming are also provided.

16 Claims, 11 Drawing Sheets

PATTERN FORMING METHOD, PATTERN FORMING APPARATUS, AND METHOD FOR MANUFACTURING SEMICONDUCTOR DEVICE

CROSS-REFERENCE TO RELATED APPLICATION

This application is based upon and claims the benefit of priority from Japanese Patent Application No. 2012-034461, filed Feb. 20, 2012; the entire contents of which are incorporated herein by reference.

FIELD

Embodiments described herein relate to the pattern forming method, the pattern forming apparatus, and the method for the manufacture of the semiconductor device.

BACKGROUND

In recent years, a method for the formation of the microfine patterns on wafers or other substrates by using a method called the imprint method has been used. In this method, a template having a micro-fine three-dimensional embossed pattern of protrusions and recesses is prepared on the surface of the template, and the embossed pattern of the template is pressed into a resin layer such as a or other pattern transferring material formed on the substrate. After the resist materials are cured in this state, the template is removed. In this way, in the surface of the resist, a three-dimensional reverse pattern of the embossed pattern of protrusions and recesses on the template is transferred into the resist material.

In such a pattern forming method, during the contacting of the pattern of the template with the resist material on the substrate, it is important to maintain an accurate spacing between the template and the substrate in order to accurately transfer the embossed pattern of the template into the resist material.

DETAILED DESCRIPTION

In general, one embodiment will be explained on the basis of figures in the following.

The figures are schematic or conceptual ones. The relationship between the thickness and the width of various parts and the ratio of sizes between the parts and so on are not restricted to be necessarily the same as the actual ones. Furthermore, even in the case of representing the same part, there may be cases in which the mutual dimensions or ratios are represented differently according to the diagrams.

Furthermore, in the present application specification document and various diagrams, the same symbols are attached to the same major elements as those described previously in regard to the diagrams that have already appeared, and a detailed explanation will be omitted appropriately.

According to the embodiment, during the contacting of the pattern of the template on the resin on the substrate, there is provided a pattern forming method capable of maintaining an accurate gap between the template and the substrate, a pattern forming apparatus, and a method for the manufacture of a semiconductor device.

The pattern forming method related to the embodiment, is a pattern forming method by using a template containing a pattern that has at least a protrusion and a recess being a reverse, or negative, three dimensional pattern of the pattern to be transferred into the resin layer on a substrate, is provided with a process for coating the resist on the substrate, a process for having the hardness of the first portion as a portion of the resist higher than the hardness of the second portion as the portion other than the first portion, and a process in which the portion other than the pattern of the template makes contact with the first portion, the contact thereof useful for maintaining a gap between the pattern transferring portion of the template and the substrate, the shape of the pattern is transferred to the second portion, and the resist is cured.

Embodiment 1

Figure 1:
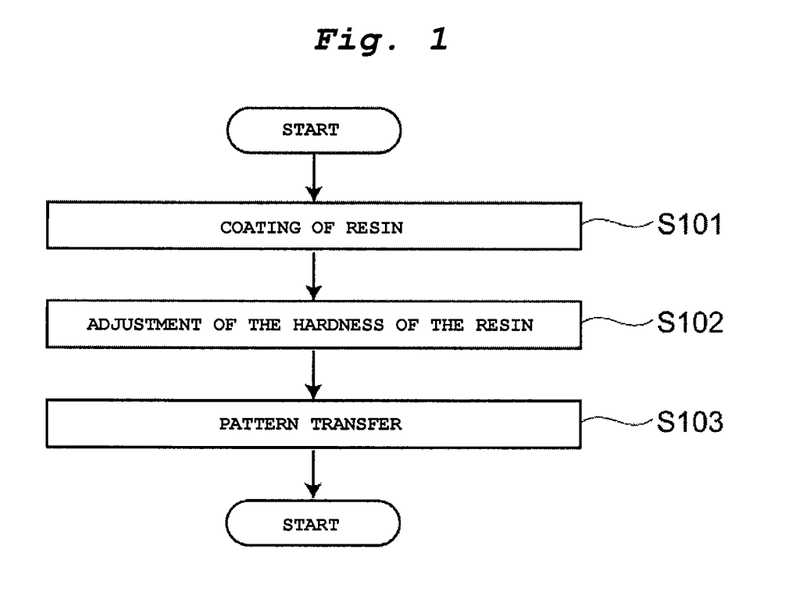
FIG. 1 is a flow chart exemplifying the pattern forming method related to the first embodiment.

FIG. 1 is a flow chart exemplifying the pattern forming method related to the first embodiment.

The pattern forming method related to the present embodiment is an imprint method by using a template containing a three-dimensional pattern that has at least one depressed section and a protruded section, which is transferred onto a resin on a substrate to provide a negative (reversed) three-dimensional pattern on the substrate.

First of all, as represented by the step S101, the resin is coated on the substrate. The resin, for example, is a photo-setting type resin, but a thermosetting type resin can also be used. In the present embodiment, the case of using the photo-setting type resin will be exemplified.

The resin is coated uniformly on the substrate. The resin is coated uniformly on the substrate by spin coating, for example.

Next, as represented by the step S102, the hardness of portions of the resin is adjusted. In other words, the hardness of the resin is adjusted so that the hardness of a first portion of the resin is greater than the hardness of a second portion of the resin.

Next, as represented by the step S103, the template pattern transfer is carried out on the second portion of the resin. Portions of the template that do not contain a pattern to be transferred may make contact with the first portion of the resin during this step. The contact between the template and the first portion of the resin may be used to gauge spacing between the template and the substrate such that a gap may be maintained to provide a desired spacing between the template and the substrate. In other words, the portion other than the pattern of the template makes contact with the first portion of the resin, in a state maintaining a gap between the template and the substrate in order to accurately transfer the shape of the pattern at a desired depth to the second portion of the resin, and then the second portion of the resin is cured.

In the pattern forming method related to the present embodiment in this manner, during positioning of the template to the substrate and the contact with the first portion of the resin, the first portion of the resin is utilized as a stop for the template. When contact between the template and the first portion of the resin is realized, the template may not be further pressed toward the substrate, and the template may remain in contact with, or be spaced away from, the first portion of the resin to regulate a gap between the template and the substrate. In doing so, during the transfer of the shape of the pattern to the resin, the gap between the template and the substrate, and particularly, the depth of the embossed pattern of the template, is set accurately.

Next, an explanation will be given in regard to the template for use in the pattern forming method related to the present embodiment.

Figure 2A:
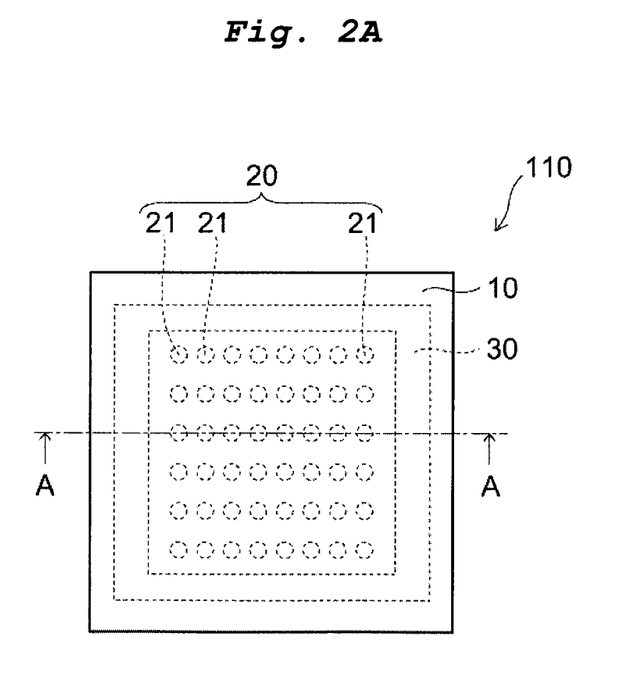
FIG. 2A and FIG. 2B are schematic diagrams exemplifying the constitution of the template for use in the pattern forming method related to the present embodiment.
Figure 2B:
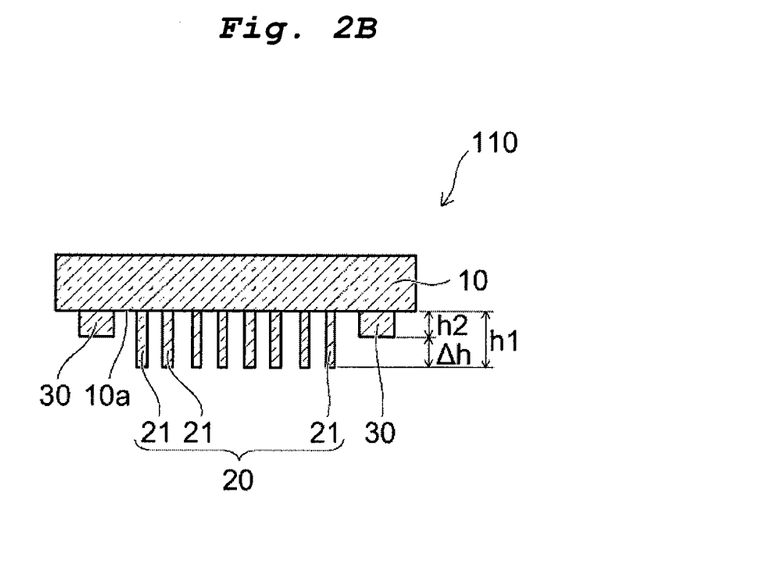

FIG. 2A and FIG. 2B are schematic diagrams exemplifying the constitution of the template for use in the pattern forming method related to the present embodiment.

FIG. 2A is a schematic planar diagram of the template; FIG. 2B is a schematic cross-sectional diagram of the line A-A shown in FIG. 2A.

As represented by FIG. 2A and FIG. 2B, a template 110 is provided with a base 10 and a pattern 20 is provided on the main surface 10a of the base 10. In the base 10, for example, quartz for the transmission of ultraviolet rays therethrough is used as the material of the base 10. In the case in which light transmission is not required, a metal, a semiconductor, an insulation material or other materials can also be used.

Protrusions 21 (first protrusions) projecting from the main surface 10a as the pattern 20 are provided in the template 110. On the main surface 10a, for example, multiple first protrusions 21, having recesses resulting therebetween, are provided to define a pattern region on the main surface 10a. The shape of the protrusions 21 is determined by the shape (for example, a circular column shape, a line shape or the like) that is formed based on the desired reverse of the shape of the pattern to be formed on a substrate.

Furthermore, on the main surface 10a of the base 10, in the portion outside the region for the formation of the pattern 20, projections 30 (second protrusions) are provided. The projections 30 are provided so that, for example, they surround the pattern 20 in one embodiment.

The projections 30 may also be provided by division into multiple locations of the main surface 10a. In the case of division into multiple locations, the projections 30 can be provided in at least three locations on a nonlinear line.

The contacting end of the projections 30 is flat, for example. The cross-sectional shape of the contacting end of the second projections 30 may also be semispherical.

As represented by FIG. 2B, the height h2 of the projections 30 from the main surface 10a is provided uniformly. In the case of the provision of the projections 30 at multiple locations, the height h2 of the projections 30 at various locations is provided uniformly.

The height h2 of the projections 30 is lower than the height h1 from the main surface 10a of the first protrusions 21. The difference Δh between the height h1 and the height h2 is the depth of the resulting recess formed by the transfer of the shape of the pattern 20 into the resin.

In such a template 110, any of at least the pattern 20 (the first protrusions 21) and the projections 30 may also be provided in one unit with the base 10. Furthermore, the base 10, the pattern 20 and the projections 30 may also be provided respectively as separate units.

Figure 3A:
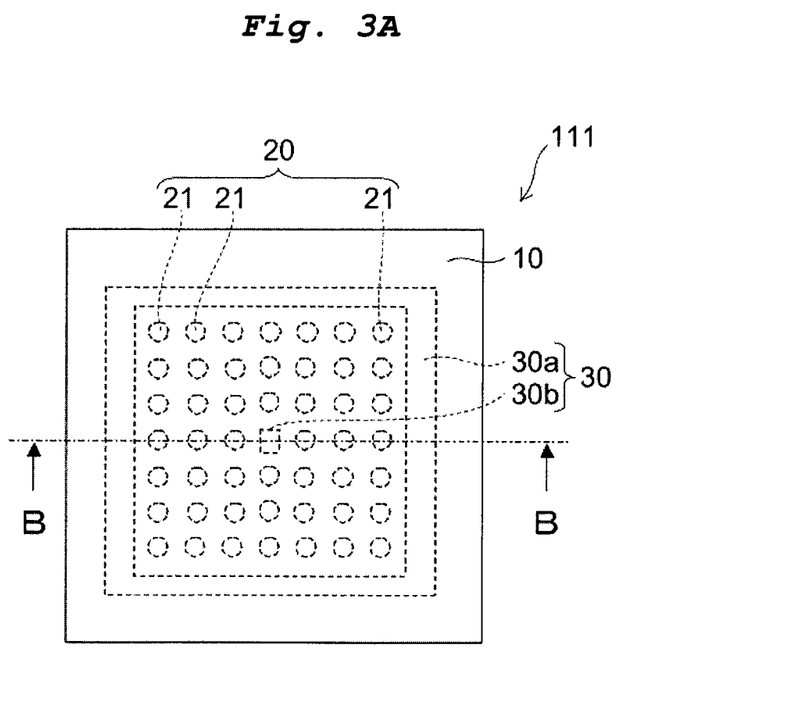
FIG. 3A and FIG. 3B are schematic diagrams showing a modified example of the template.
Figure 3B:
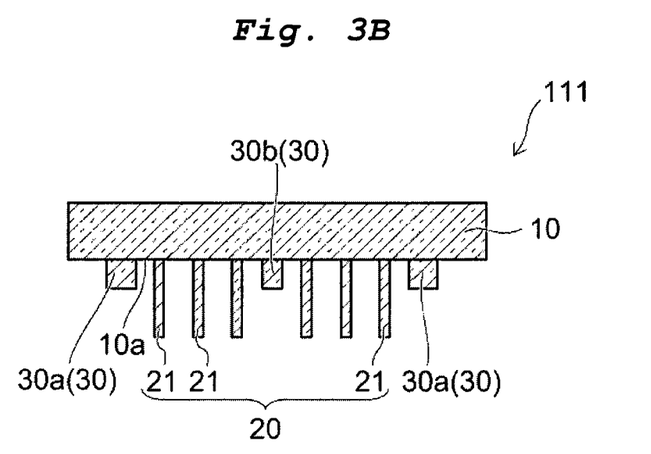

FIG. 3A and FIG. 3B are schematic diagrams showing a modified example of the template.

FIG. 3A is a schematic planar diagram of the template, and FIG. 3B is a schematic cross-sectional diagram of the line B-B shown in FIG. 3A.

As represented by FIG. 3A and FIG. 3B, the template 111, in the same manner as the template 110 represented by FIG. 2A and FIG. 2B, is provided with the base 10 and the pattern 20 provided on the main surface 10a of the base 10. On the other hand, in the template 111, the arrangement of the projections 30 is different from that for the template 110. In the template 111, the projections 30 provided on the main surface 10a of the base 10 have outside projections (first projection 30a) provided so that they surround the region for the formation of the pattern 20 and inside projections (second projections 30b) provided in the inside of the region for the formation of the pattern 20.

The first projections 30a may also be provided by division into multiple locations of the main surface 10a. In the case of division into multiple locations, the first projections 30a can be provided in at least three locations on a nonlinear line. Furthermore, the second projections 30b may also be provided in a continuous form (frame form). Furthermore, the second projection 30b may also be provided by division into multiple locations of the main surface 10a. In this embodiment, the template 111 comprises multiple pattern regions comprising the protrusions 21 in locations adjacent the first projections 30a and second projections 30b.

In the template 111, in the same manner as the template 110, any of at least the pattern 20, the projections 30a and the projections 30b may also be provided in one unit with the base 10. Furthermore, the base 10, the pattern 20, the projections 30a and the projections 30b may also be provided respectively as separate units.

Figure 4A:
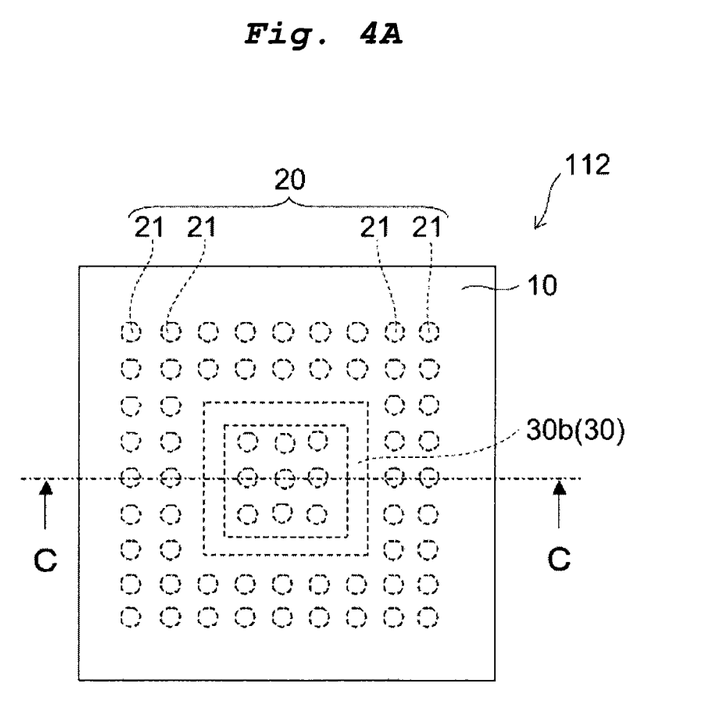
FIG. 4A and FIG. 4B are schematic diagrams showing another modified example of the template.
Figure 4B:
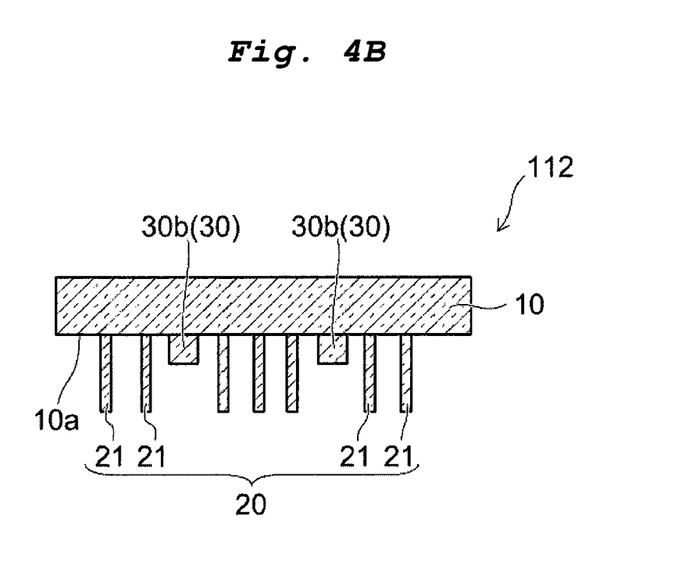

FIG. 4A and FIG. 4B are schematic diagrams showing another modified example of the template.

FIG. 4A is a schematic planar diagram of the template, and FIG. 4B is a schematic cross-sectional diagram along the line C-C shown in FIG. 4A.

As represented by FIG. 4A and FIG. 4B, the template 112, in the same manner as the template 110 represented by FIG. 2A and FIG. 2B, is provided with the base 10 and the pattern 20 provided on the main surface 10a of the base 10. On the other hand, in the template 112, the arrangement of the projections 30 is different from that for the template 110.

In the template 112, the projections 30 provided on the main surface 10a of the base 10 have the inside projections 30b provided in the inside of the region for the formation of the pattern 20. In other words, the projections 30 in the template 112 have the second projections 30b only. For example, the second projections 30b may be provided in a frame form. Furthermore, the second projections 30b may also be provided by division into multiple locations of the main surface 10a.

In the template 112, in the same manner as the template 110 and the template 111, any of at least the pattern 20 and the projections 30b may also be provided in one unit with the base 10. Furthermore, the base 10, the pattern 20, and the projections 30b may also be provided respectively as separate units.

Next, the specific example of the pattern forming method will be explained.

FIG. 5A to FIG. 6C are schematic cross-sectional diagrams showing a specific example of the pattern forming method.

In FIG. 5A to FIG. 6C, an example for the manufacture of the semiconductor device 300 (shown in FIG. 6C) by the pattern forming method related to the present embodiment is given.

In this specific example of the pattern forming method, the template 110 shown in FIG. 2A and FIG. 2B will be used.

Figure 5A:
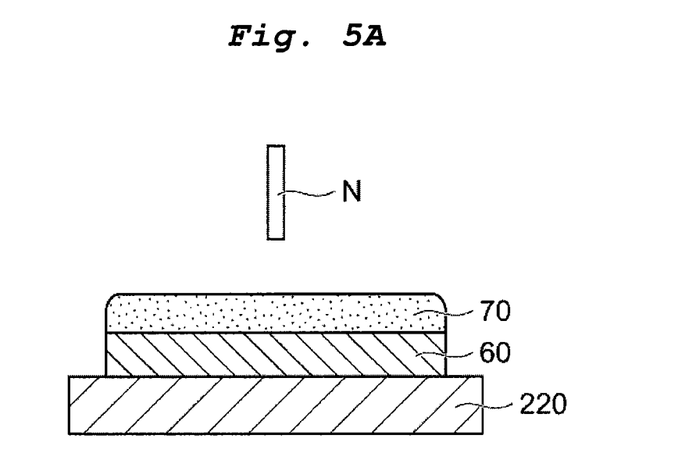
FIG. 5A to FIG. 5C are schematic cross-sectional diagrams showing a specific example of the pattern forming method.

First of all, as shown in FIG. 5A, a substrate 60 is loaded on a stage 220. As the substrate 60, for example, a semiconductor substrate (a silicon wafer or the like) is used. The substrate 60 may also be a material formed by the provision of a semiconductor layer on an insulation substrate. On the substrate 60, a transistor or other elements may also be formed.

Next, a resin 70 is coated on top of the substrate 60. As the resin 70, a photo-setting type resin or a thermosetting type resin can be used. The resin 70 can be discharged toward the substrate 60 from a nozzle N, for example. The resin 70 is provided at a uniform thickness on the substrate 60 by spin coating or the like. The thickness of the resin 70 is, for example, 50 nanometers (nm).

Figure 5B:
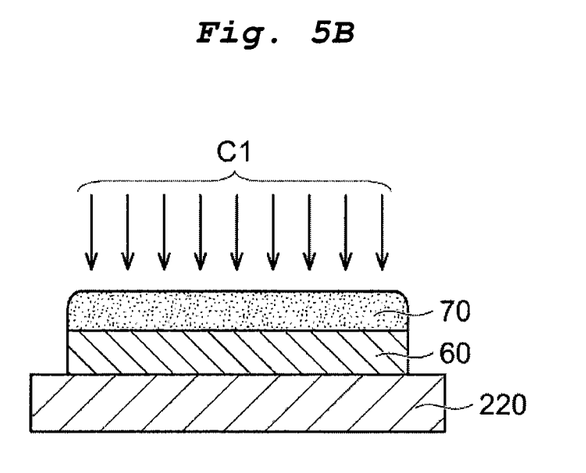

Next, as shown in FIG. 5B, the resin 70 layer is semi-cured. Here, the cured state of the resin 70 can be represented by, for example, a curing ratio. The curing ratio is a value representing the progression of the curing. A curing ratio of 100% is a state beyond which no curing proceeds, and a curing ratio of 0% for a state in which no curing has occurred. The semi-curing of the resin 70 refers to the fact that the curing ratio of the resin 70 is, for example, in the range of more than 25% and less than 75%, for example, more than 40% and less than 60%.

In the case in which the resin 70 is a photo-setting resin, a first light C1 is irradiated on the overall resin 70. For example, for the ultraviolet light irradiation-setting type resin, the ultraviolet light is irradiated as the first light C1. The ultraviolet light is discharged from a high pressure mercury lamp or a laser light source.

In the case in which the resin 70 is a thermosetting resin or a photo-setting and thermosetting resin, it can also be brought to a semi-cured state in the same manner by heating.

Figure 5C:
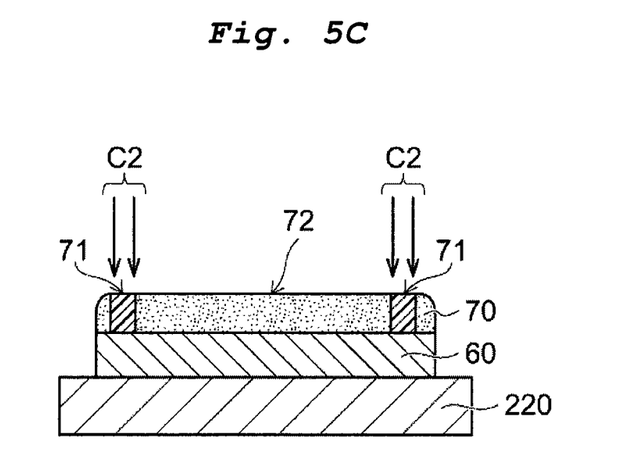

Next, as shown in FIG. 5C, the hardness of the first portion 71 of the resin 70 is brought to be higher than the second portion 72 of the resin. Here, the curing ratio of the first portion 71 of the resin 70 is brought to more than 25% and less than 75%, for example, more than 40% and less than 60%. In one aspect, the curing ratio of the first portion 71 is 100% (complete curing) while the curing ratio of the second portion 72 is less than 100%.

In the case in which the resin 70 is a photo-setting resin, a second light C2 is irradiated only on the first portion 71 of the resin 70 to provide the additional curing thereof. The second light C2 may have an intensity that is greater than the intensity of the first light C1. The second light C2 may be a light beam separate from the first light C1, or may be the same intensity of the first light C1 for a longer time period. For example, for the ultraviolet light irradiation-setting type resin, the ultraviolet light is irradiated as the first light C1 while the second portion 72 is shielded from the first light C1 by a mask or covering, or by control of the direction and position of the light from the first light source C1. In this embodiment, the ultraviolet light may be provided by a high pressure mercury lamp or a laser light source.

In the case in which the resin 70 is a thermosetting resin or a photo-setting and thermosetting resin, it is also acceptable that only the first portion 71 is cured by partial heating.

Here, the first portion 71 is located such that, during the placing of the template 110 on top of the resin 70, the second protrusions 30 of the template 110 at least partially overlap with, so as to be brought into contact with, the first portion 71 of the resin 70 and thus enable limitation of the movement of the template in the direction of the underlying substrate. The first portion 71 can be continuous or divided into multiple discrete locations. By this curing treatment, the entire thickness of the first portion 71 of the resin 70 is cured to a desired hardness relative to the hardness of the second portion 72 of the resin 70.

By the treatments of FIG. 5B and FIG. 5C, the hardness of the first portion 71 of the resin 70 is greater than the hardness of the second portion 72. For the treatments of FIG. 5B and FIG. 5C, it is also acceptable that the curing of the first portion 71 is carried out first as shown in FIG. 5C, then the semi-curing of the resin 70 is carried out as shown in FIG. 5B.

Figure 6A:
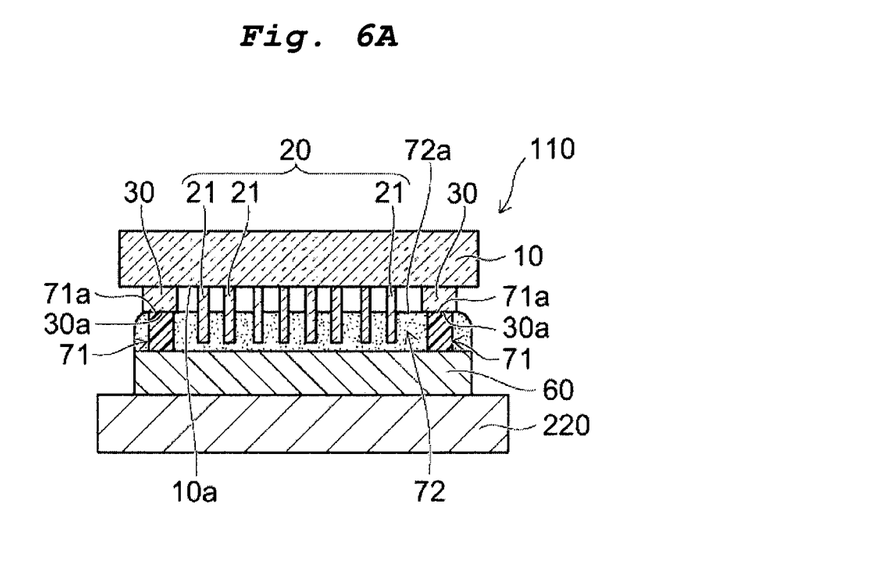
FIG. 6A to FIG. 6C are schematic cross-sectional diagrams showing a specific example of the pattern forming method.

Next, as shown in FIG. 6A, the template 110 is placed over top of the resin 70, and the protrusions 21 of the pattern 20 makes contact with the resin 70. At this time, if the gap between the template 110 and the substrate 60 is gradually decreased, the front end side 30a of the protrusions 30 of the template 110 will make contact with the top side 71a of the first portion 71 of the resin 70. At this contacting position, the gap between the template 110 and the substrate 60 is set. In other words, with the first portion 71 functioning as a stop for the extension of the template 110 toward the substrate 60, the gap or spacing between the template 110 and the substrate 60 is set accurately.

During the step of pressing the template 110 into the resin 70, The second portion 72 of the resin 70 is in a semi-cured state. Furthermore, since the height h1 (refer to FIG. 2B) of the first protrusions 21 of the pattern 20 of the template 110 is higher than the height h2 (refer to FIG. 2B) of the projections 30, only the difference Δh (refer to FIG. 2B) extends into the second portion 72 of the resin 70. Furthermore, in the state of the contacting of the projections 30 with the top side 71a of the first portion 71, the gap between the main surface 10a and the surface 72a of the second portion 72 is set. This gap is equivalent to the height h2 of the projections 30.

In this way, the first portion 71 of the resin 70 is the stop and the gap between the template 110 and the substrate 60 can be set accurately. Therefore, the pattern 20 of the template 110 does not contact the substrate 60. Furthermore, the template 110 is arranged virtually parallel to the substrate 60 because the resin layer 70 is uniform in thickness, and thus each of the first portions 71 forming the stop have the same height. Since the template 110 is accurately arranged to engage the first portions 71 of the resin layer 70, the protrusions 21 of the pattern 20 enter the second portion 72 of the resin 70 at a desired depth.

Here, it is also acceptable that the template 110 makes contact with the resin 70 when pressing of the template 110 is carried out, and the opposing force exerted on the template 110 is measured. In other words, if the projections 30 of the template 110 and the first portion 71 of the resin 70 make contact, the opposing force is exerted from the projections 30 with respect to the pressing force on the template 110. It is also acceptable that this opposing force is measured and, in the case in which the measured opposing force reaches a preset value, the pressing is stopped.

The measurement of this opposing force can also be carried out at multiple locations in the plane along the main surface 10a. By the measurement of the opposing force at multiple locations, a balance is ascertained in the plane of the pressing force of the template 110. Furthermore, it is also acceptable to adjust the balance of pressure in the plane of the pressing force of the template 110 on the basis of the measured value of the opposing force at multiple locations. For example, it is also acceptable to adjust the pressing force of the template 110 so that it is uniform in the plane or to make the adjustment so that a constant pressure differential is provided in the plane in the pressing force which will ensure that the template is stopped against the first portions 71 across the entire surface of the substrate, and thus lays flat against the underlying substrate 60.

Figure 6B:
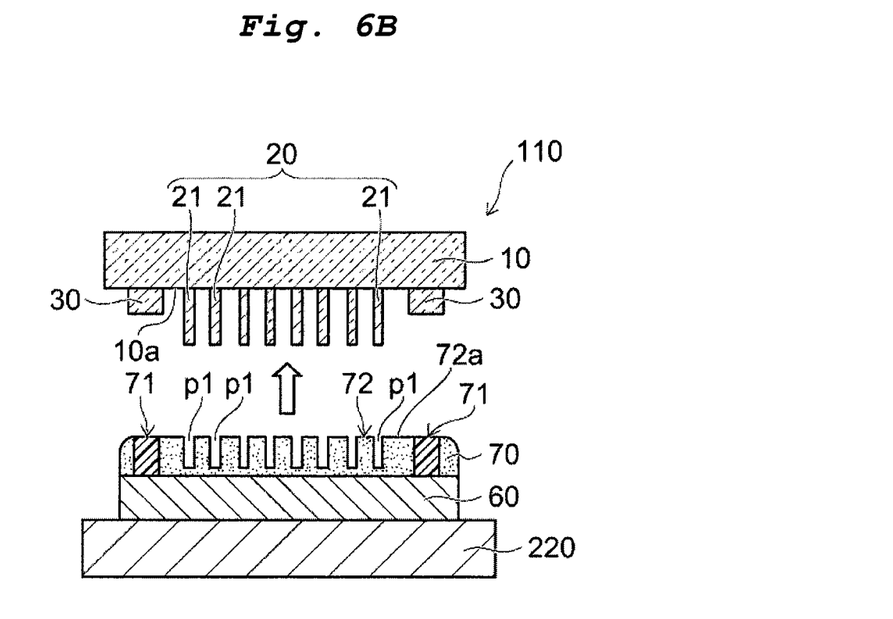

Next, as shown in FIG. 6B, the template 110 is subjected to mold releasing from the resin 70. In doing so, in the second portion 72 of the resin 70, a pattern of depressions or recesses p1 extend inwardly from the surface of the cured resin layer 70 as a negative, or reverse three dimensional pattern of the protrusions 21 of the pattern 20 on the template 110. Since the second portion 72 is in a semi-cured state, the shape of the pattern of depressions p1 is maintained even if the template 110 is subjected to mold releasing. In other words, the semi-cured hardness of the second portion 72 of the resin 70 hardness (the curing ratio) may be required for maintaining the shape of the pattern of depressions p1 during mold releasing. Furthermore, in placing the template 110 on top of the resin 70, since the gap between the main surface 10a and the surface 72a of the second portion 72 has been provided, during the mold releasing of the template 110, no force above what is required to press the template into the semi cured second portion 72 of the resin layer 70 is exerted on the template 110 in the opposite direction to remove the template 110 from the resin layer 70. By removing the template 110 from the resin 70 while the second portion 72 of the resin 70 remains in the semi-cured state, the breaking or damaging of the pattern of depressions p1 during the mold releasing of the template 110 on top of the resin 70 is suppressed.

Figure 6C:
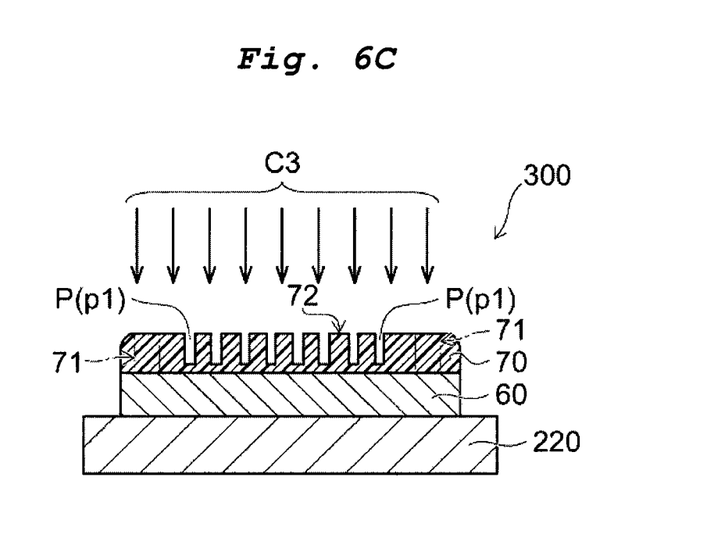

Next, as shown in FIG. 6C, after the template 110 is removed from the resin layer 70, the treatment for the curing of the resin 70 as a whole is carried out. Here, the curing is completed to the curing ratio of 100%. In the case in which the resin 70 is a photo-setting type resin, a third light C3 is irradiated on the overall resin 70. For example, for an ultraviolet light irradiation-setting type resin, the ultraviolet light is irradiated as the third light C3. The irradiation energy (intensity) of the third light C3 may be greater than the irradiation energy (intensity) of the first light C1 during the semi-curing of the resin 70. In the case in which the first portion 71 of the resin 70 has been completely cured, with this final curing treatment, only the second portion 72 is further cured.

In the case in which the resin 70 is a thermosetting resin or a photo- and thermosetting resin, by the heating of the overall resin 70, the resin 70 is completely cured.

By the complete curing of the resin 70, a transfer pattern P formed by the reversion of the shape of the pattern 20 in the resin 70 is formed. As a portion of the manufacturing process for the formation of this transfer pattern P, the semiconductor device 300 is manufactured. The transfer pattern P is used as a portion of the semiconductor device 300, for example. Furthermore, the transfer pattern P is used as a mask during the etching of an underlying base material, then removed afterwards.

By such a pattern forming method, the gap between the template 110 and the substrate 60 is set accurately in the imprint method. In doing so, during the contacting of the template 110 with the resin 70, the contacting of the pattern 20 of the template 110 and the substrate 60 is prevented. Furthermore, the input amount (depth) of the protrusions 21 into the resin 70 is stabilized and equalized across the surface of the substrate and the field (area of the resin layer 70 over which the recesses p1 area provided). Therefore, the reversed transfer pattern P (the three dimensional reverse or negative of the pattern of recesses and protrusions of the template 110) is formed accurately in the resin 70 layer. Furthermore, since the first portion 71 of the resin 70 is used as a stop of the template 110, it is unnecessary to provide a stop on another part of the pattern forming apparatus, and the stop height is precisely aligned with the height of the resin 70 layer.

In the pattern forming method described above, as shown in FIG. 6B, after the mold releasing of the template 110 from the resin 70, the curing of the resin 70 as a whole is carried out as shown in FIG. 6C. However, it is also acceptable that, as shown in FIG. 6A, in the state in which contact of the template 110 with the resin 70 occurs, the curing of the resin 70 as a whole is carried out without the mold releasing of the template 110 and, after the curing of the resin 70, the template 110 is mold-released from the resin 70.

Furthermore, in the pattern forming method described above, the second portion 72 of the resin 70 is brought to the semi-cured state in the process shown in FIG. 5B. However, it is also acceptable that, with the second portion 72 not cured as such, only the first portion 71 is, for example, completely cured with the process as shown in FIG. 5C, then the subsequent process is carried out. In this case, with the process as shown in FIG. 6A, in the state in which contact of the template 110 with the resin 70 occurs, the resin 70 as a whole is subjected to curing without the mold releasing of the template 110. It is acceptable that the template 110 is mold-released from the resin 70 after the curing. Additionally, because a gap is also present between the exposed outer surface of the resin 70 layer and the base of the template 110 in the regions of the template 110 between each of the projections 21, the surface area of contact between the template 110 surface and the resin 70 are reduced, resulting in less overall adhesion between the template 110 surface sand the resin, and thus a lower overall force needed to remove the template from the resin 70, both where the resin is cured after template 100 removal, or before the template 110 is removed, as compared to full penetration of the template 110 into the resin 70 layer.

Figure 7A:
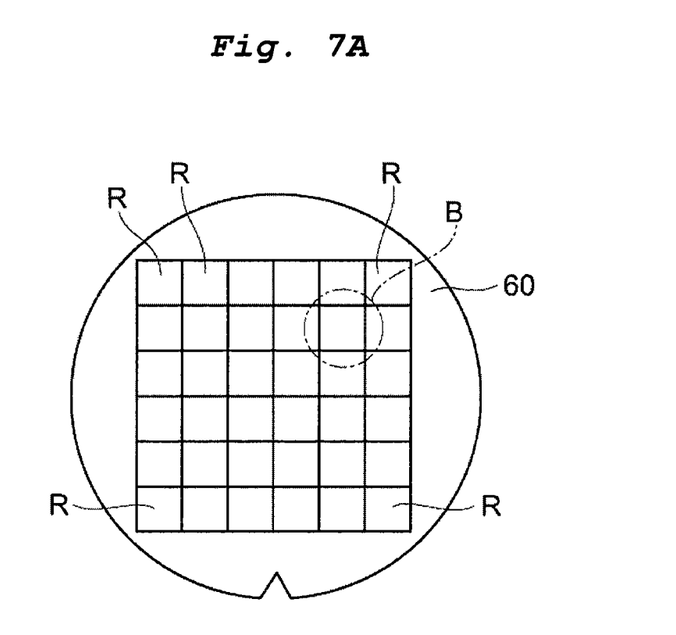
FIG. 7A and FIG. 7B are schematic diagrams for exemplification in regard to multiple transfer regions.
Figure 7B:
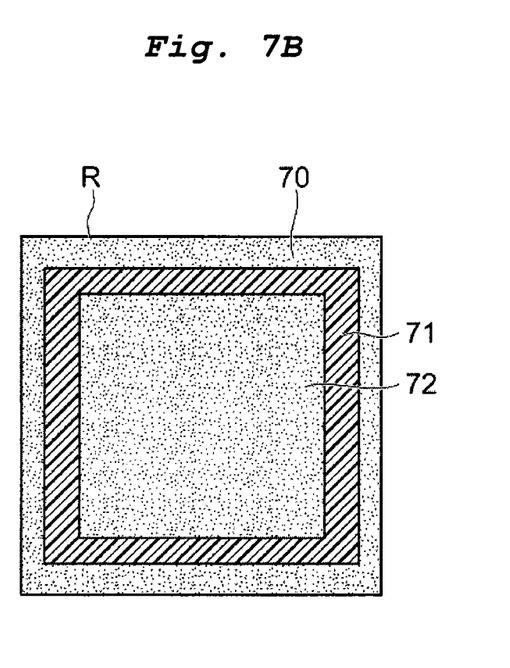

FIG. 7A and FIG. 7B are schematic diagrams for exemplification in regard to multiple transfer regions.

FIG. 7A is the whole planar diagram, and FIG. 7B is the enlarged diagram of the section B in FIG. 7A.

As shown in FIG. 7A, in the case of the provision of multiple transfer regions R in one substrate 60, the transfer of the pattern with one template 110 is repeated in sequence in regard to the multiple transfer regions R. Each transfer region R may comprise one or more die or device regions of the die or devices to be formed on the substrate 60. As shown in FIG. 7B, the resin 70 coated on the transfer regions R has a first portion 71 and a second portion 72. The first portion 71 is provided in the region outside the region of the formation of the transfer pattern P. The second portion 72 is provided in the region of the formation of the transfer pattern P. In regard to the process (refer to the step S102, FIG. 5B and FIG. 5C) for the adjustment of the hardness of the resin 70, the hardness adjustment process is carried out before the contacting of the template 110 with the resin 70.

It is also acceptable that the process for the adjustment of the hardness of the resin 70 is carried out before the contacting of the template 110 in regard to the respective multiple transfer regions R. It is also acceptable that the hardness of the resin 70 is adjusted at the same time in at least two of the multiple transfer regions R. In other words, it is also acceptable that, after the simultaneous adjustment of the hardness of the resin 70 of all multiple transfer regions R, the formation of the transfer pattern P with the template 110 is carried out in sequence in regard to the respective various transfer regions R. To reduce the quantity of resin, and thus underlying substrate area, used by the first portions 71, the portions of the first portion 71 adjacent to an adjacent transfer region may be used in both transfer regions to form a portion of the stop for the template 110 in that region.

In the pattern forming method described above, the method for the formation of the transfer pattern P has been exemplified by using the template 110. However, the same effect is seen when using the templates 111 and 112 (FIGS. 3A and 4A).

Furthermore, in addition to the materials like the templates 110, 111 and 112 having the projections 30 in the base 10, it is also acceptable to use a template having no projections 30. In this case, it is also acceptable that, where the thickness of the resin 70 layer, and thus the thickness of the first regions 71, are greater than the length or span of the protrusions 21 from the base 10 of the template, a portion of the main surface 10a of the base 10 and the second portion 72 are allowed to make contact, the transfer of the pattern 20 is carried out, and a mold releasing agent is coated on the main surface 10a of the base 10. In doing so, during the mold releasing of the template from the resin 70, the adherence force between the main surface 10a and the resin 70 is decreased, and the destruction of the template, the breaking and damaging of the resin 70 and so on are suppressed.

Embodiment 2

Figure 8:
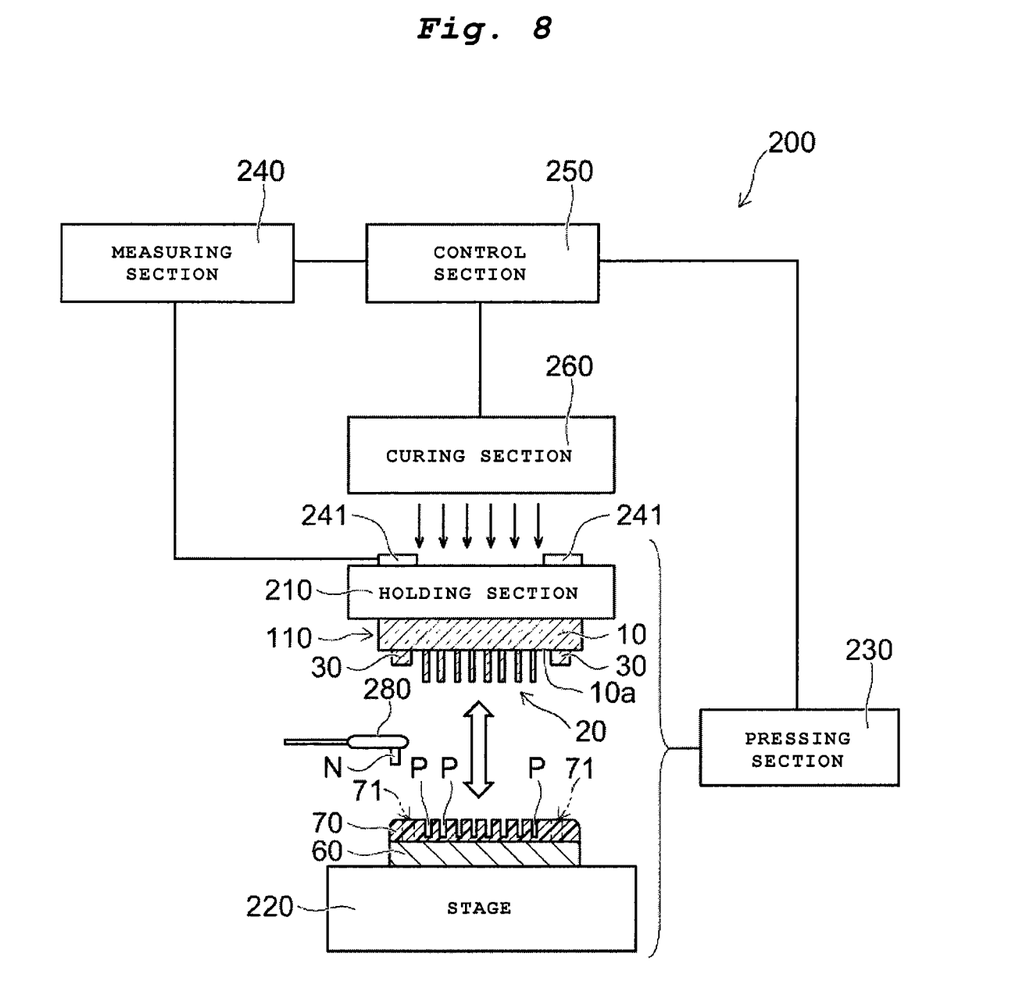
FIG. 8 is a schematic diagram exemplifying the pattern forming apparatus related to the second embodiment.

FIG. 8 is a schematic diagram exemplifying the pattern forming apparatus related to the second embodiment.

As shown in FIG. 8, the pattern forming apparatus 200 related to the second embodiment is an imprint apparatus by using a pattern 20 containing a template 110 having a three-dimensional pattern that has at least one depression and protrusion for transferring a reversed image of the three-dimensional pattern 20 in the resin 70 on the substrate 60.

The pattern forming apparatus 200 is provided with a holding section 210, a stage 220, a pressing section 230, a measuring section 240, and a control section 250.

The holding section 210 is for holding the template 110. The holding section 210, for example, adsorbs and holds the side opposite to the pattern 20 of the base 10 of the template 110 by vacuum.

The stage 220 is for the fixation of the substrate 60 at a desired position relative to the template, i.e., to align the substrate 60 and template 110 The resin 70 is coated on top of the substrate 60. It is also acceptable that the coating section 280 containing the nozzle N for coating the resin 70 is provided in the pattern forming apparatus 200.

The pressing section 230 is for carrying out the pressing of the pattern 20 into the resin 70 by moving either the holding section 210 or the stage 220 toward each other. A driving mechanism (not shown in the diagram) is provided in the holding section 210 or the stage 220 for facilitating this movement. The pressing section 230 moves at least the holding section 210 or the stage 220 with the driving mechanism to vary the gap between the two.

The measuring section 240 is for the measurement of the opposing force during the contacting of the template 110 with the resin 70. The measuring section 240 includes a sensor 241. The sensor 241 is provided on, for example, the side opposite to the side holding the template 110 of the holding section 210. The sensor 241, for example, is a load cell. With this sensor 241, the opposing force is detected during the contacting of the template 110 with the resin 70. The measuring section 240 receives the detected value sent from the sensor 241, and sends a signal representative thereof to the control section 250.

The control section 250 is for controlling the pressing force of the pattern 20 onto the resin 70 by the pressing section 230 according to the opposing force measured with the measuring section 240. The control section 250 carries out the control to stop the pressing of the template 110 by the pressing section 230, for example, when the opposing force measured with the measuring section 240 meets a preset threshold value.

Figure 9:
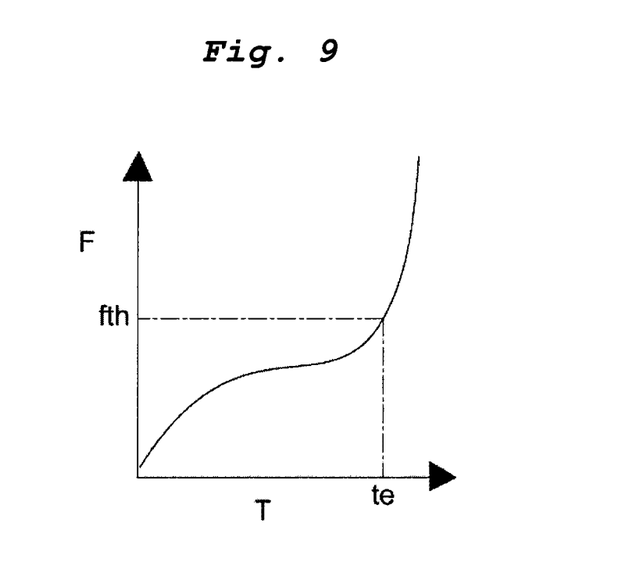
FIG. 9 is a diagram exemplifying the relationship between time and the opposing force.

FIG. 9 is a diagram exemplifying the relationship between time and the opposing force measured with the measuring section 240.

The abscissa shown in FIG. 9 represents the time T of the pressing of the template 110 on the resin 70, and the ordinate represents the opposing force F received by the template 110.

In this embodiment, in the case of contacting of the template 110 with the resin 70, with the first portion 71 of the resin 70 as the stop, the gap between the template 110 and the substrate 60 is set. As shown in FIG. 9, the opposing force F is generated from the time of contact with the pattern 20 of the template 110 with the resin 70, and the opposing force F increases drastically at the time of contacting of the template 110 with the first portion 71 of the resin 70.

At the location where this opposing force F increases drastically, the threshold value $f_{th}$ is provided. The control section 250 renders the indication of the pressure to the pressing section 230, and determines whether or not the opposing force F measured with the measuring section 240 exceeds the threshold value $f_{th}$. The control section 250, in the case of the opposing force F exceeding the threshold value $f_{th}$ (time $t_e$), renders the indication to stop the pressing to the pressing section 230. In doing so, the contacting of the template 110 with the first portion 71 of the resin 70 is accurately determined.

The curing section 260 has the function of curing the resin 70. The curing section 260 may be configured to cure only the first portion 71 of the resin 70. Furthermore, the curing section 260 may be configured to cure the resin 70 as a whole.

In the case of using a photo-setting resin as the resin 70, the curing section 260 has a light source (not shown in the diagram) for the discharging of light for the curing of the resin 70. As the light source for the partial curing of the first portion 71, for example, a laser light source can be used. As a light source for the curing of the resin 70 as a whole, for example, a high pressure mercury lamp can be used.

In the case of using a thermosetting resin as the resin 70, the curing section 260 has a heat source (not shown in the diagram) for heating the resin 70 for curing.

The pattern forming method as shown in FIG. 5A to FIG. 6C, for example, can be carried out with the pattern forming apparatus 200 related to the present embodiment. In other words, with the pattern forming apparatus 200 related to the present embodiment, the pattern forming method as shown in FIG. 5A to FIG. 6C is carried out for the formation of the pattern. In doing so, the semiconductor device 300 containing a pattern or the like can be manufactured.

Embodiment 3

Figure 10A:
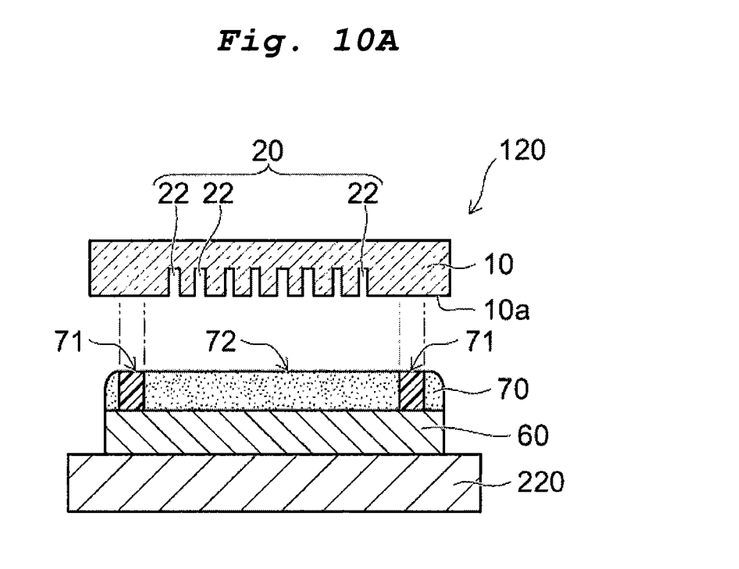
FIG. 10A to FIG. 10C are schematic cross-sectional diagrams exemplifying the pattern forming method related to the third embodiment.
Figure 10B:
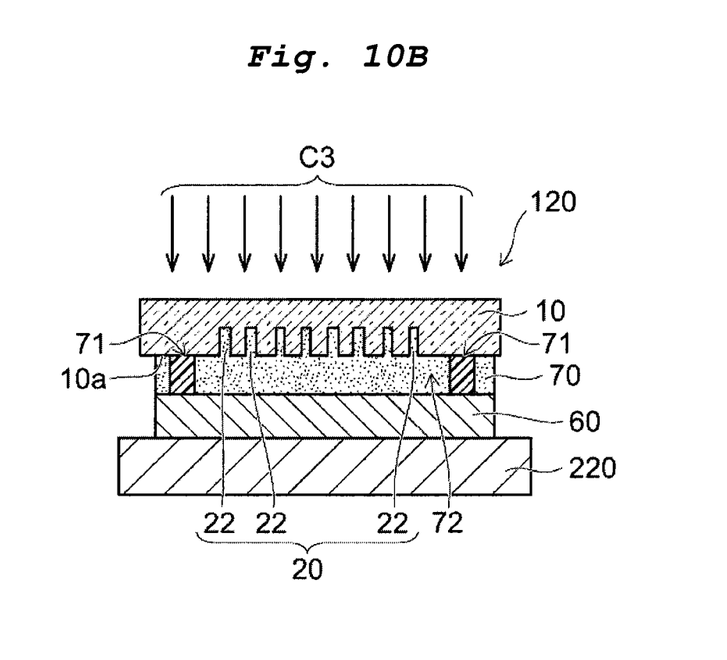
Figure 10C:
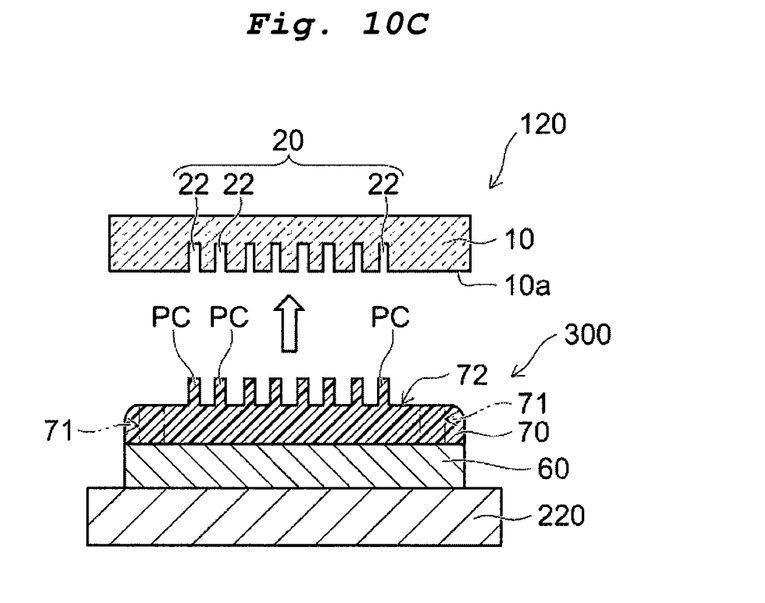

FIG. 10A to FIG. 10C are schematic cross-sectional diagrams exemplifying the pattern forming method related to the third embodiment.

The pattern forming method related to the present embodiment is an imprint method that uses a template 120 having the pattern 20 including a plurality of recesses 22 extending inwardly of the base 10 of the template 120.

This template 120 is provided with the base 10, and the pattern 20 provided into the main surface 10a of the base 10. As the base 10, for example, quartz for the transmission of ultraviolet light is used. On the main surface 10a, for example, multiple recesses 22 are provided. The recesses 22 have a shape (a circular columnar shape, a line shape or the like) formed as a reverse three dimensional pattern of the three dimensional pattern to be formed in the resin 70 layer. In the template 120, the region other than the region containing the recesses 22 for the formation of the pattern 20 is the main surface 10a.

In the formation of the pattern using this template 120, first of all, as shown in FIG. 10A, the substrate 60 is loaded on the stage 220. As the substrate 60, for example, a semiconductor substrate (a silicon wafer or the like) can be used. It is also acceptable that the substrate 60 is a material formed by the provision of a semiconductor layer on top of the insulation substrate. On the substrate 60, a transistor or other elements may also be formed.

Next, the resin 70 is coated on top of the substrate 60. As the resin 70, for example, a photo-setting organic material can be used. The resin 70 is discharged from, for example, the nozzle N toward the substrate 60. The resin 70 is provided at a uniform thickness on top of the substrate 60 by spin coating or the like. The thickness of the resin 70 is, for example, 50 (nm).

Next, the hardness of the first portion 71 of the resin 70 is made greater than the hardness of the second portion 72. Here, the second portion 72 of the resin 70 is not cured. In one aspect, the curing rate of the first portion 71 is 100% (complete curing) while the curing rate of the second portion 72 is less than 100%.

In the case in which the resin 70 is a photo-setting type resin, light is irradiated on only the first portion 71 of the resin 70 (refer to FIG. 5C). In the case in which the resin 70 is a thermosetting type resin or a photo-setting and thermosetting type resin, the curing of only the first portion 71 by partial heating is also acceptable. The second portion 72 of the resin 70 is not cured as such.

Next, as shown in FIG. 10B, the template 120 is placed over the resin 70, and the pattern 20 makes contact with the resin 70. At this time, if the gap between the template 120 and the substrate 60 is gradually decreasing, a portion of the main surface 10a other than the region of the template 120 for the formation of the pattern 20 will make contact with the first portion 71 of the resin 70. At this contacting position, the gap between the template 120 and the substrate 60 is set. In other words, with the first portion 71 functioning as a stop, the gap between the template 120 and the substrate 60 is set accurately.

If the pattern 20 of the template 120 makes contact with the resin 70, due to the surface tension of the resin 70, the resin 70 enters the inside of the recesses 22 of the pattern 20.

Next, in a state of contacting of the template 120 with the resin 70, the treatment for the curing of the resin 70 as a whole is carried out. Here, the curing is complete curing (the curing ratio 100%). In the case in which the resin 70 is a photo-setting type resin, the third light C3 is irradiated on the overall resin 70 via the template 120. For example, for an ultraviolet light irradiation-setting type resin, the ultraviolet light is irradiated as the third light C3. Since the first portion 71 of the resin 70 has already been cured completely, with this treatment, only the second portion 72 is cured completely.

In the case in which the resin 70 is a thermosetting resin or a photo-setting and thermosetting resin, by the heating of the overall resin 70, the resin 70 is completely cured.

After the completion of the curing of the overall resin 70, as shown in FIG. 10C, the template 120 is mold released from the resin 70. In doing so, in the second portion 72 of the resin 70, the transfer pattern (PC) comprising a plurality of projections is formed as a reverse three dimensional image of the three dimensional pattern of the recesses 22 in the resin 70 layer.

As a portion of the manufacturing process for the formation of this transfer pattern PC, the semiconductor device 300 is manufactured. The transfer pattern PC can be used as a portion of the semiconductor device 300, for example. Furthermore, the transfer pattern PC is used as a mask during the etching of a base material, then removed afterwards.

By such a pattern forming method, the gap between the template 120 and the substrate 60 is set accurately in the imprint method. In doing so, during the contacting of the template 120 with the resin 70, the contacting of the pattern 20 of the template 120 and the substrate 60 is prevented. Furthermore, the amount of the resin 70 that enters the protruded sections (protrusions 21) is stabilized. Therefore, the transfer pattern PC is formed accurately in the resin 70.

As explained above, with the pattern forming method, the pattern forming apparatus and the method for the manufacture of the semiconductor device, in causing the contacting of the pattern of the template with the resin on the substrate, a precise gap between the template and the substrate can be maintained.

The present embodiments have been explained above. However, the present invention is not to be restricted to these examples. For example, with respect to the various embodiments described above, the materials formed by the conduction of the addition, elimination, or design changes constitutional elements, for appropriate, or the materials formed by the appropriate combination of characteristics of the various embodiments by those in the industry, as long as they maintain the gist of the present invention, are included in the scope of the present invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method using a template containing a base and a pattern that has at least one of a recess or at least one protrusion forming a pattern that is transferred into a resin on a substrate resulting in a reverse image of the pattern being formed on the substrate, the pattern forming method comprising:

coating the resin on the substrate;

adjusting a hardness of the resin so that the hardness of a first portion of the resin is greater than the hardness of a second portion of the resin;

maintaining a gap between a base of the template and the substrate by bringing the first portion into contact with a portion of the template that does not include the pattern region;

transferring the pattern region to the second portion of the resin; and curing the resin to completion.

2. The pattern forming method according to claim 1, wherein maintaining the gap between the base of the template and the substrate comprises:

pressing the template toward the resin to bring the portion of the template into contact with the first portion;

measuring an opposing force exerted on the template by the contacting; and stopping the pressing when the opposing force reaches a predetermined value.

3. The pattern forming method according to claim 1, wherein adjusting the hardness of the resin comprises:
complete curing of only the first portion of the resin and the semi-curing of the overall resin.

4. The pattern forming method according to claim 1, wherein adjusting the hardness of the resin comprises:
completely curing of only the first portion of the resin while the second portion of the resin is semi-cured.

5. The pattern forming method according to claim 1, wherein curing the resin comprises the detachment of the template from the resin after the resin is semi-cured and after the pattern makes contact with the resin.

6. The pattern forming method according to claim 1, wherein curing the resin comprises the transfer of the pattern to the resin and, after the detachment of the template from the resin, completely curing the resin.

7. A pattern forming method using a template containing a pattern comprising at least one protrusion and at least one recess forming a pattern region that is transferred into a resin on a substrate resulting in a reverse image of the pattern of the pattern region on the substrate,
the pattern forming method comprising:
coating the resin on the substrate;
curing a first portion of the resin and the partial curing of a second portion of the resin;
moving the template and/or the substrate toward one another to provide contact with the first portion of the resin and a portion of the template that does not include the pattern region;
measuring an opposing force exerted on the template during the contacting;
stopping the moving when the opposing force reaches a predetermined value, such that a gap is formed between the template and the substrate;
transferring the pattern region to the second portion of the resin; and
curing the resin to completion.

8. The pattern forming method according to claim 7, further comprising curing the first portion of the resin to completion before moving the template and/or the substrate with respect to each other.

9. The pattern forming method according to claim 8, wherein, during the pressing, the portion of the template contacting the first portion of the resin comprises one or more projections extending from a main surface of a base of the template.

10. The pattern forming method according to claim 9, wherein the one or more projections are positioned outside of the pattern region.

11. The pattern forming method according to claim 10, wherein the one or more projections comprises a single first projection defining a rectangular shape.

12. The pattern forming method according to claim 9, wherein the one or more projections comprises a single projection defining a rectangular shape between within a portion of the pattern region.

13. The pattern forming method according to claim 7, wherein, during the pressing, the portion of the template contacting the first portion of the resin comprises a main surface of a base of the template.

14. The pattern forming method according to claim 7, wherein the partially curing the resin comprises curing the resin to about 25% to about 75% before the complete curing of the second portion of the resin.

15. A method for manufacturing a semiconductor device, the method comprising a pattern forming method using a template containing a base and a pattern that has at least one of a recess or at least one protrusion forming a pattern region that is transferred onto a resin on a substrate resulting in a reverse image of the pattern region on the substrate,
the pattern forming method comprising:
coating the resin on the substrate;
adjusting a hardness of the resin so that the hardness of a first portion of the resin is greater than the hardness of a second portion of the resin;
maintaining a gap between a base of the template and the substrate by bringing the first portion into contact with a portion of the template that does not include the pattern region;
transferring the pattern region to the second portion of the resin; and
curing the resin.

16. A method for manufacturing a semiconductor device, the method comprising a pattern forming method using a template containing a pattern comprising at least one protrusion or at least one depression forming a pattern region that is transferred onto a resin on a substrate resulting in a reverse image of the pattern region on the substrate,
the pattern forming method comprising:
coating the resin on the substrate;
partially curing the resin;
completely curing a first portion of the resin and partially curing of a second portion of the resin;
moving the template and/or the substrate towards one another to provide contact between the first portion of the resin and a portion of the template that does not include the pattern region;
measuring an opposing force exerted on the template during the contacting;
stopping the moving when the opposing force reaches a predetermined value, such that a gap is formed between the template and the substrate;
transferring the pattern region to the second portion; and
completely curing the second portion of the resin.

* * * * *